(12) United States Patent
Maeda

(10) Patent No.: US 12,078,681 B2
(45) Date of Patent: Sep. 3, 2024

(54) BATTERY INSPECTION SYSTEM

(71) Applicant: Murata Machinery, Ltd., Kyoto (JP)

(72) Inventor: Masaaki Maeda, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 95 days.

(21) Appl. No.: 17/802,466

(22) PCT Filed: Nov. 9, 2020

(86) PCT No.: PCT/JP2020/041752
§ 371 (c)(1),
(2) Date: Aug. 25, 2022

(87) PCT Pub. No.: WO2021/171709
PCT Pub. Date: Sep. 2, 2021

(65) Prior Publication Data
US 2023/0140040 A1    May 4, 2023

(30) Foreign Application Priority Data

Feb. 26, 2020 (JP) .................................. 2020-030581

(51) Int. Cl.
*G01R 31/36* (2020.01)
*B65G 1/137* (2006.01)
(Continued)

(52) U.S. Cl.
CPC .......... *G01R 31/36* (2013.01); *B65G 1/1371* (2013.01); *B65G 57/32* (2013.01); *B65G 59/12* (2013.01)

(58) Field of Classification Search
None
See application file for complete search history.

(56) References Cited

U.S. PATENT DOCUMENTS 4,363,407 A * 12/1982 Buckler .................. B07C 5/344
209/3.3
5,940,303 A    8/1999 Sakai et al.
(Continued)

FOREIGN PATENT DOCUMENTS

JP    7-97004 A    4/1995
JP    10-227832 A    8/1998
(Continued)

OTHER PUBLICATIONS

International Search Report dated Dec. 28, 2020, of corresponding International Application No. PCT/JP2020/041752 along with an English translation.

*Primary Examiner* — Jas A Sanghera
(74) *Attorney, Agent, or Firm* — DLA Piper LLP (US)

(57) ABSTRACT

A battery inspection system includes a controller configured to perform: group control of managing a predetermined number of batteries taken in by a take-in conveyor as a same group; inspection control of controlling a conveying device to bring the batteries taken in by the take-in conveyor into an inspection device that is not performing inspection, and also controlling the conveying device to retrieve the batteries that have been inspected from the inspection device; and storage control of controlling the conveying device to store at least some of the batteries retrieved from the inspection device into the storage device, and also controlling the conveying device to continuously deliver a set of batteries of the same group from the inspection device or the storage device to the take-out conveyor.

7 Claims, 8 Drawing Sheets

(51) Int. Cl.
  *B65G 57/32* (2006.01)
  *B65G 59/12* (2006.01)

(56) References Cited

U.S. PATENT DOCUMENTS

| | | | |
|---|---|---|---|
| 2008/0038098 A1 | 2/2008 | Ito et al. | |
| 2020/0363344 A1* | 11/2020 | Heo | G01N 23/046 |
| 2021/0364550 A1 | 11/2021 | Kagami | |

FOREIGN PATENT DOCUMENTS

| | | |
|---|---|---|
| JP | 2013-195132 A | 9/2013 |
| JP | 2019-062138 A | 4/2019 |
| KR | 2007-0062501 A | 6/2007 |
| KR | 2011-0095023 A | 8/2011 |

\* cited by examiner

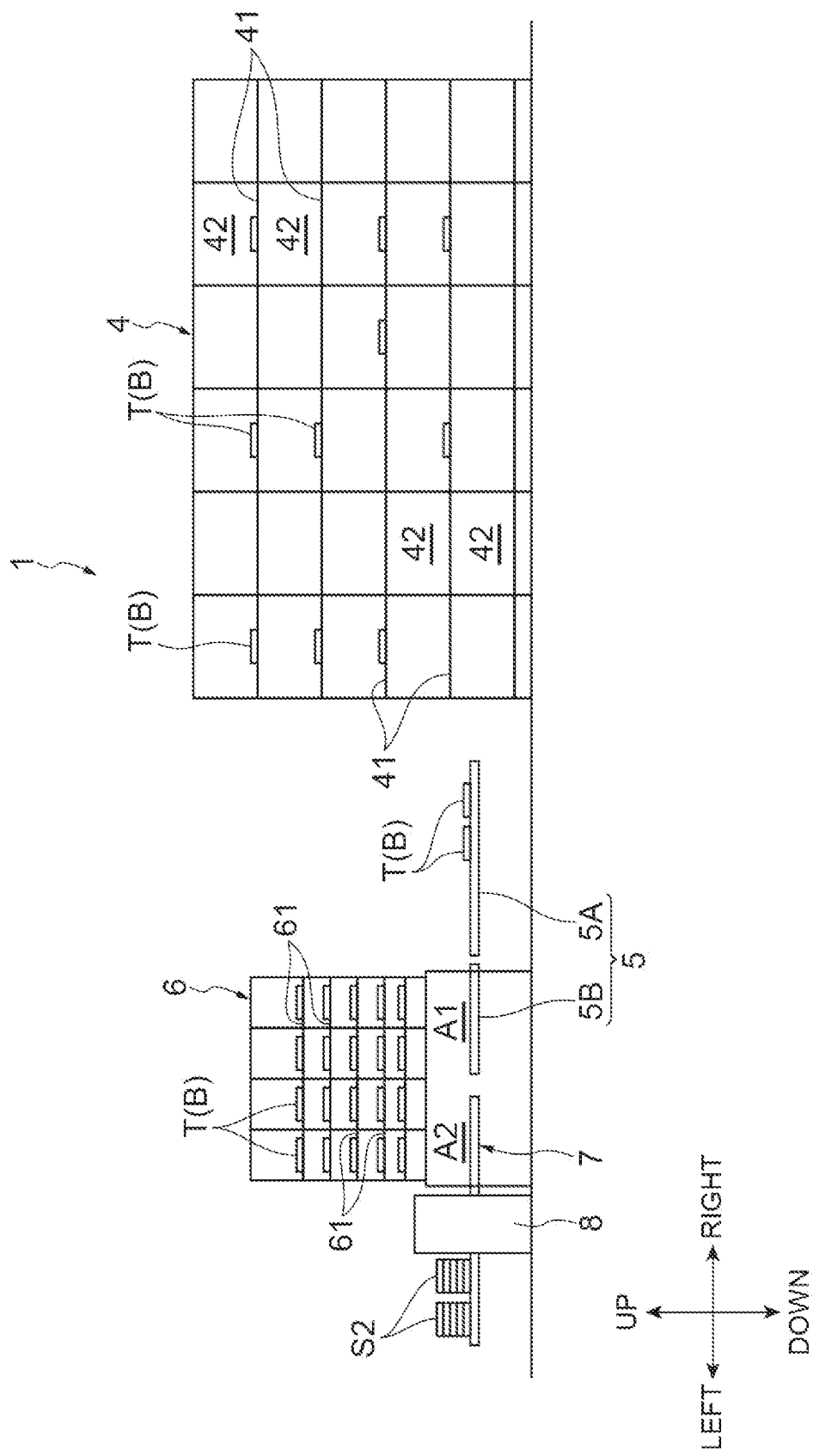

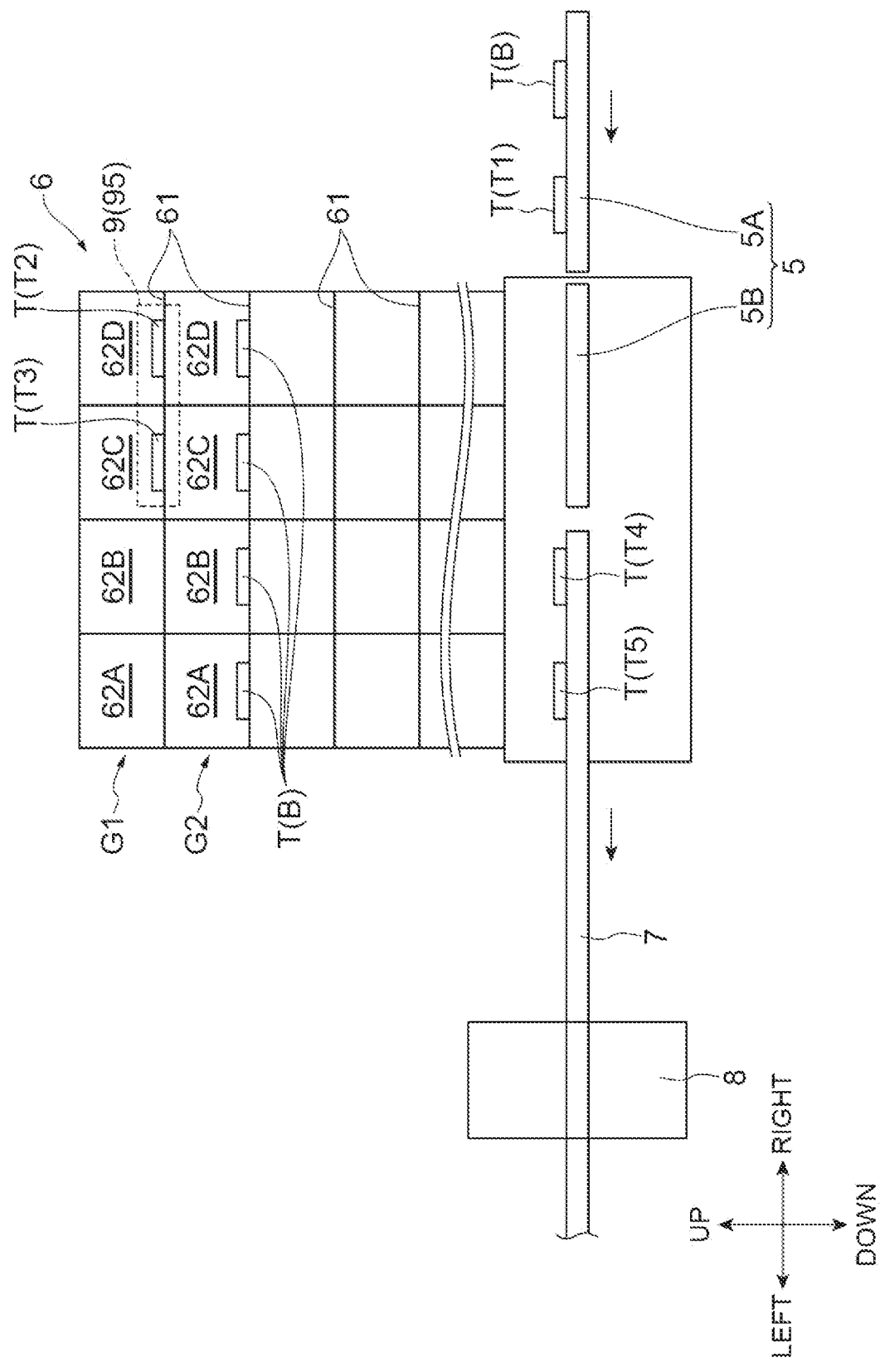

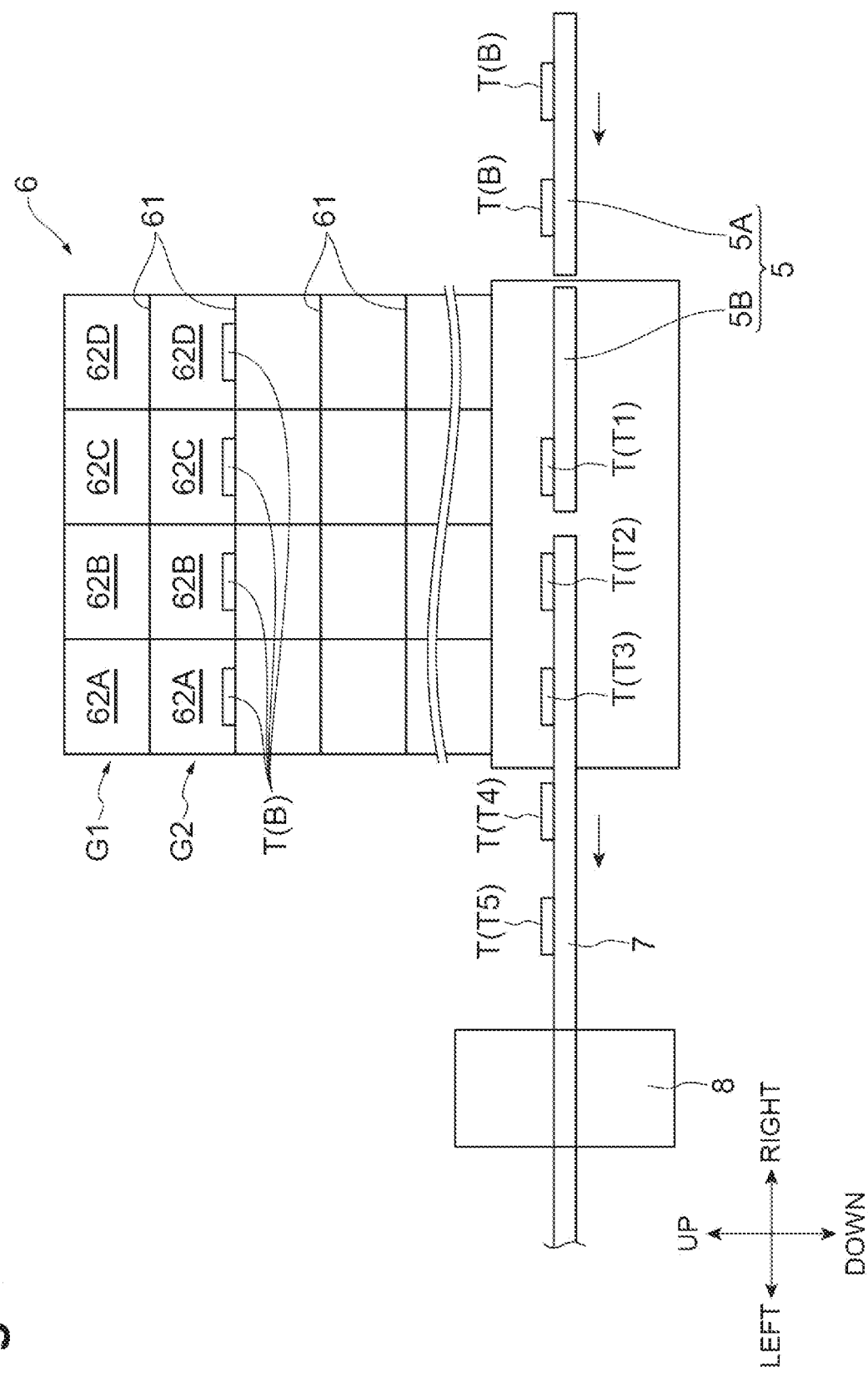

BATTERY INSPECTION SYSTEM

TECHNICAL FIELD

This disclosure relates to a battery inspection system.

BACKGROUND

As an inspection system for inspecting inspection objects conveyed from outside, an inspection system configured to conduct an instrumental error test between a plurality of measuring instruments is known as described in Japanese Unexamined Patent Publication No. 2013-195132, for example. The inspection system described in Japanese Unexamined Patent Publication No. 2013-195132 includes: a plurality of inspection devices configured to inspect inspection objects, a take-in device configured to take inspection objects conveyed from outside into the respective inspection devices; a plurality of storage devices provided corresponding to the respective inspection devices and configured to temporarily store the inspection objects; and a take-out device configured to take the inspection objects out of the respective storage devices.

In that inspection system, a plurality of batteries that have been taken into the inspection devices around the same time or a plurality of batteries that are classified as the same lot (also "desired battery set") or the like need to be taken out together in some instances. However, in the configuration of the conventional inspection system described above, in which inspected batteries are stored from the inspection devices into the storage devices in the order they have been inspected and the batteries are taken out from the storage devices in the order they have been stored, a battery included in the desired battery set is not necessarily present at a front position of the storage devices. As a result, batteries other than those included in the desired battery set have to be taken out, and consequently there is a situation in which the desired battery set cannot be taken out together. Furthermore, the time spent at the storage device waiting for the batteries included in the desired battery set to be taken out reduces the operating rate in the inspection devices.

It could therefore be helpful to provide a battery inspection system that can increase the operating rate in the inspection devices and take out a desired battery set together.

SUMMARY

I thus provide a battery inspection system for inspecting a battery that includes: an inspection device configured to be able to inspect a plurality of batteries simultaneously; a storage device including a plurality of shelves configured to store the batteries that have been inspected by the inspection device; a take-in conveyor configured to take the batteries into the battery inspection system from outside; a take-out conveyor configured to take the batteries out of the battery inspection system; a conveying device configured to convey the batteries between the take-in conveyor and the inspection device, between the inspection device and the storage device, and between the storage device and the take-out conveyor; and a controller configured to control the battery inspection system. The controller performs: group control of managing a predetermined number of the batteries taken in by the take-in conveyor as the same group; inspection control of controlling the conveying device to bring the batteries taken in by the take-in conveyor into the inspection device that is not performing inspection, and also controlling the conveying device to retrieve the batteries that have been inspected from the inspection device; and storage control of controlling the conveying device to store at least some of the batteries retrieved from the inspection device into the storage device, and also controlling the conveying device to continuously deliver a set of batteries of the same group from the inspection device or the storage device to the take-out conveyor.

In the battery inspection system thus configured, the set of batteries that have been grouped when having been taken in by the take-in conveyor is taken out together by the take-out conveyor. This allows a desired battery set to be taken out together. Furthermore, batteries that have been inspected are immediately retrieved from the inspection device, and thus the next batteries can be immediately received. This can increase the operating rate in the inspection device.

The battery inspection system may further include a stacking device provided midway on a path of the take-out conveyor and configured to stack the batteries to form an outgoing stack. The controller may perform stacking control of controlling the stacking device to form the outgoing stack with a set of batteries of the same group. In this configuration, the outgoing stack of the battery set of the same group can be taken out.

The battery inspection system may further include an unstacking device provided midway on a path of the take-in conveyor and configured to unstack the batteries of an incoming stack, in which the batteries are stacked, one by one. The group control may manage a set of batteries constituting one incoming stack and unstacked by the unstacking device as the same group. In this configuration, the set of batteries conveyed in a stacked state can be individually taken into the inspection device.

The battery inspection system may further include: a stacking device provided midway on a path of the take-out conveyor and configured to stack the batteries to form an outgoing stack; and an unstacking device provided midway on a path of the take-in conveyor and configured to unstack an incoming stack, in which the batteries have been stacked, into individual batteries. The group control may manage a set of batteries constituting one incoming stack and unstacked by the unstacking device as the same group. The controller may perform stacking control of controlling the stacking device to form the outgoing stack with a set of batteries of the same group. In this configuration, even when a set of batteries taken in as an incoming stack are individually taken into the inspection device, the outgoing stack can be formed with the set of batteries of the same group again and taken out.

The conveying device may include a transfer unit capable of simultaneously transferring the batteries accommodated side by side horizontally in the storage device. When the batteries have been simultaneously removed from the storage device and the removed batteries have been simultaneously placed on the take-out conveyor, the storage control may cause the storage device to store the batteries such that the outgoing stack is formed in stacking order of the incoming stack or reverse order to the stacking order. In this configuration, when a stack stacked in the same order as in the incoming stack is taken out, the efficient control can be performed, whereby the processing capacity can be improved.

The storage control may control the conveying device such that batteries managed as the same group are stored on horizontally adjacent shelves. In this configuration, when stacks are formed with the same set of batteries constituting each incoming stack and are taken out, the efficient control can be performed, whereby the processing capacity can be improved.

The storage control may take out a set of batteries of the same group to the take-out conveyor in stacking order of the incoming stack or reverse order to the stacking order. In this configuration, the outgoing stack formed in the stacking order of the incoming stack or the reverse order can be taken out.

At least one of the batteries constituting the incoming stack may be provided with an identifier, and the group control may manage the same group based on the identifier. This configuration allows the same group to be easily managed.

The conveying device may include a transfer unit capable of simultaneously transferring the batteries accommodated side by side horizontally in the storage device, and the storage control may control the conveying device such that the batteries managed as the same group are stored on horizontally adjacent shelves. In this configuration, when stacks are formed with the same set of batteries constituting each incoming stack and are taken out, the efficient control can be performed, whereby the processing capacity can be improved.

The group control may manage defective batteries that have been determined to be defective by the inspection device as the same group. The storage control may control the conveying device to continuously deliver the defective batteries, the number of which is the predetermined number, from the inspection device or the storage device to the take-out conveyor. In this configuration, the defective batteries can be taken out together.

The battery inspection system may further include a carrying conveyor provided between the inspection device and the storage device, and the conveying device may include: a first conveying device configured to convey the batteries between the take-in conveyor and the inspection device and between the inspection device and the carrying conveyor; and a second conveying device configured to convey the batteries between the carrying conveyor and the storage device and between the storage device and the take-out conveyor. In this configuration, conveyance of batteries between the take-in conveyor and the inspection device, between the inspection device and the carrying conveyor, and between the storage device and the take-out conveyor, where bottlenecks are more likely to occur, is performed by the two conveying devices in a distributed manner. This prevents reduction in conveyance efficiency.

The operating rate in the inspection device can thus be increased, and also the desired battery set can be taken out together.

BRIEF DESCRIPTION OF THE DRAWINGS

FIG. 2 is a front view of the battery inspection system taken along line II-II.

FIG. 7 is a diagram illustrating the example of storage control in the battery inspection system.

FIG. 8 is a diagram illustrating the example of storage control in the battery inspection system.

REFERENCE SIGNS LIST

Figure 1:
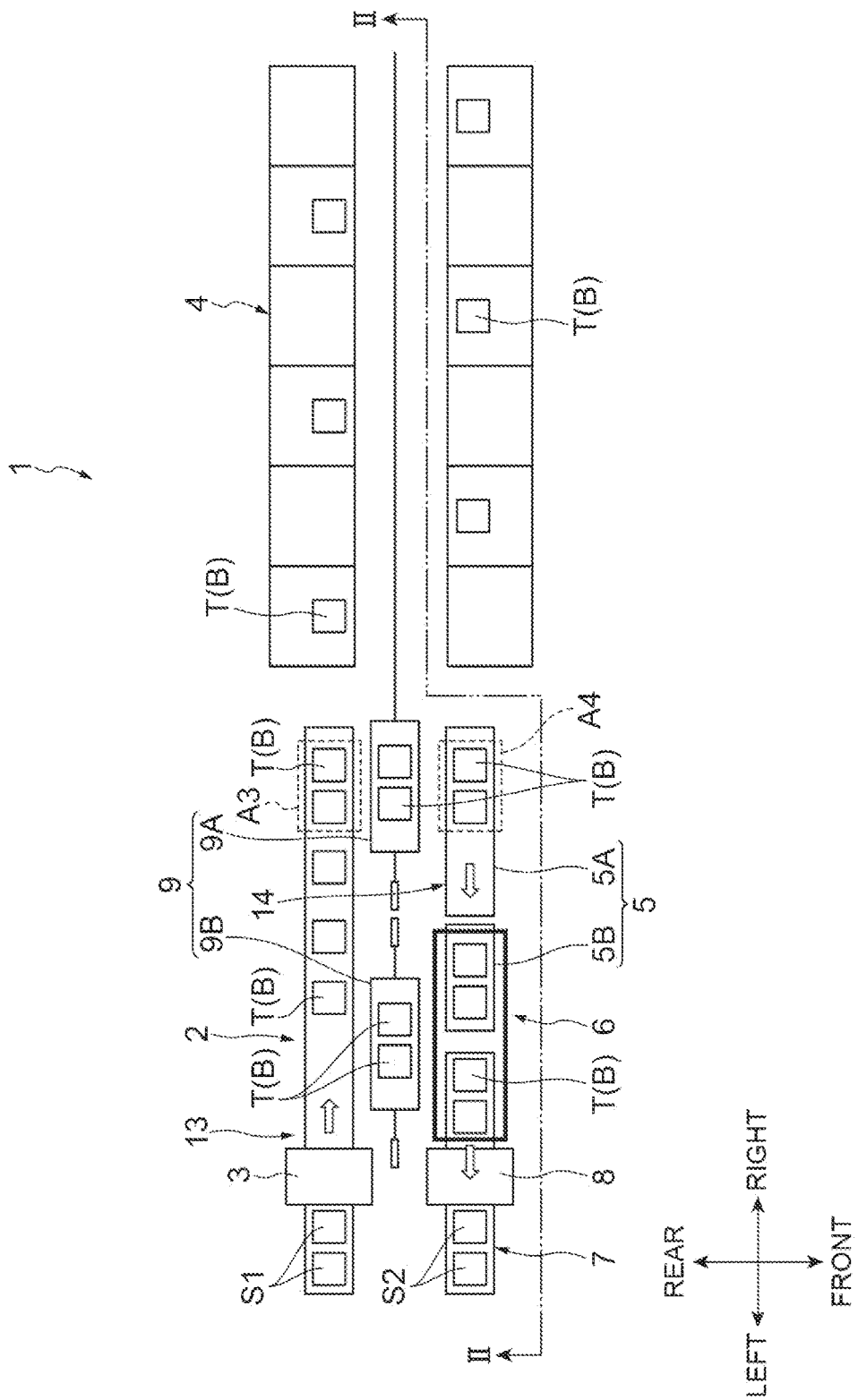
FIG. 1 is a diagram illustrating an overall configuration of a battery inspection system 1 according to an example.

1 battery inspection system
2 take-in conveyor
3 unstacking device
4 inspection device
5 carrying conveyor
5A first carrying conveyor
5B second carrying conveyor
6 storage device
61 shelf
7 take-out conveyor
8 stacking device
9 conveying device
95 transfer unit
9A first conveying device
9B second conveying device
10 controller
B battery
S stack
T tray
TG tag (identifier)

DETAILED DESCRIPTION

Hereinafter, a battery inspection system 1 according to an example will be described with reference to the drawings. In description of the drawings, like elements are designated by like reference signs, and duplicate description is omitted.

The battery inspection system 1 is a system that takes in and takes out batteries B to and from an inspection device 4 configured to perform one process of inspection processes (e.g., a charge-discharge inspection process, a voltage/current/resistance inspection process, and an aging process) of secondary batteries such as lithium-ion batteries. As illustrated in FIGS. 1 and 2, the battery inspection system 1 includes a take-in conveyor 2, an unstacking device 3, a conveying device 9, the inspection device 4, a carrying conveyor 5, a storage device 6, a take-out conveyor 7, and a stacking device 8. The left, right, front, rear, up, and down directions defined in FIGS. 1 and 2 will be used in the following description. FIG. 2 is a front view when viewed from the arrow direction in FIG. 1, and illustration of the conveying device 9, the take-in conveyor 2, and the unstacking device 3 is omitted therein for the sake of convenience of explanation.

The take-in conveyor 2 takes batteries B from outside into the battery inspection system 1. In this example, the batteries B are taken in from outside in the form of an incoming stack S1, in which the batteries B are accommodated in trays T and the trays T are stacked. The take-in conveyor 2 is, for example, a device such as a belt conveyor or a roller conveyor configured to convey an incoming stack S1 while supporting the bottom thereof. The term "battery B accommodated in a tray T" may be simply expressed as "battery B". The take-in conveyor 2 is controlled by a controller 10 (see FIG. 5).

Figure 3A:
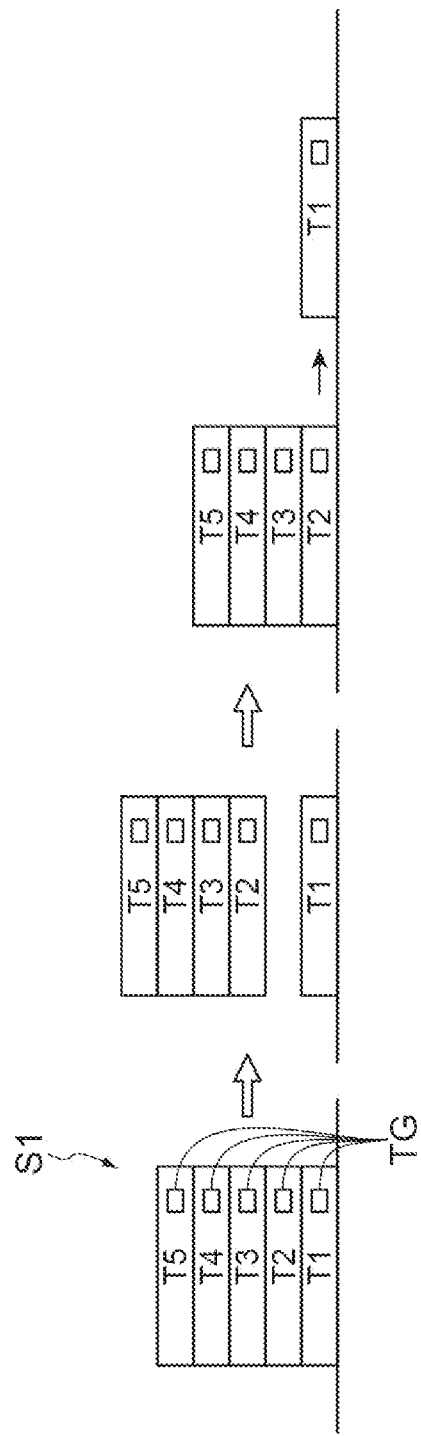
FIG. 3(A) is a diagram illustrating how batteries are unstacked by an unstacking device.

The unstacking device 3 is provided midway on a path of the take-in conveyor 2. The unstacking device 3 is a device configured to unstack trays T, which are stacked as an incoming stack S1, into individual ones. Specifically, by operation of the unstacking device 3 and the take-in conveyor 2, the incoming stack S1 is unstacked into individual trays T. More specifically, as illustrated in FIG. 3(A), the unstacking device 3 leaves the lowermost tray T1 and lifts the other trays T2 to T5. The take-in conveyor 2 conveys the lowermost tray T1 downstream for a certain distance, and then stops. Subsequently, after placing the lifted trays T2 to T5 on the take-in conveyor 2, the unstacking device 3 leaves the lowermost tray T2 and lifts the other trays T3 to T5. By repeating these processes of lifting trays T by the unstacking device 3 and intermittent conveyance by the take-in conveyor 2, the trays T are conveyed downstream one by one. The unstacking device 3 is controlled by the controller 10 (see FIG. 5).

Referring back to FIGS. 1 and 2, a first acquisition unit 13 configured to read a tag TG affixed to each tray T is provided downstream of the unstacking device 3 in the take-in conveyor 2. The first acquisition unit 13 transmits acquired information to the controller 10 (see FIG. 5). The tag TG is used to acquire information on a battery B stored in each tray T, to confirm that the battery B is yet to be inspected, and to record inspections passed/failed in the inspection device 4.

The conveying device 9 conveys batteries B between the take-in conveyor 2 and the inspection device 4, between the inspection device 4 and the storage device 6, and between the storage device 6 and the take-out conveyor 7. More specifically, the conveying device 9 includes: a first conveying device 9A configured to convey batteries B between the take-in conveyor 2 and the inspection device 4 and between the inspection device 4 and a first carrying conveyor 5A; and a second conveying device 9B configured to convey the batteries B between the first carrying conveyor 5A and the storage device 6 and between the storage device 6 and the take-out conveyor 7. In FIG. 1, the first conveying device 9A is disposed on the right side, and the second conveying device 9B is disposed on the left side. The first conveying device 9A and the second conveying device 9B are controlled by the controller 10 (see FIG. 5).

Figure 4:
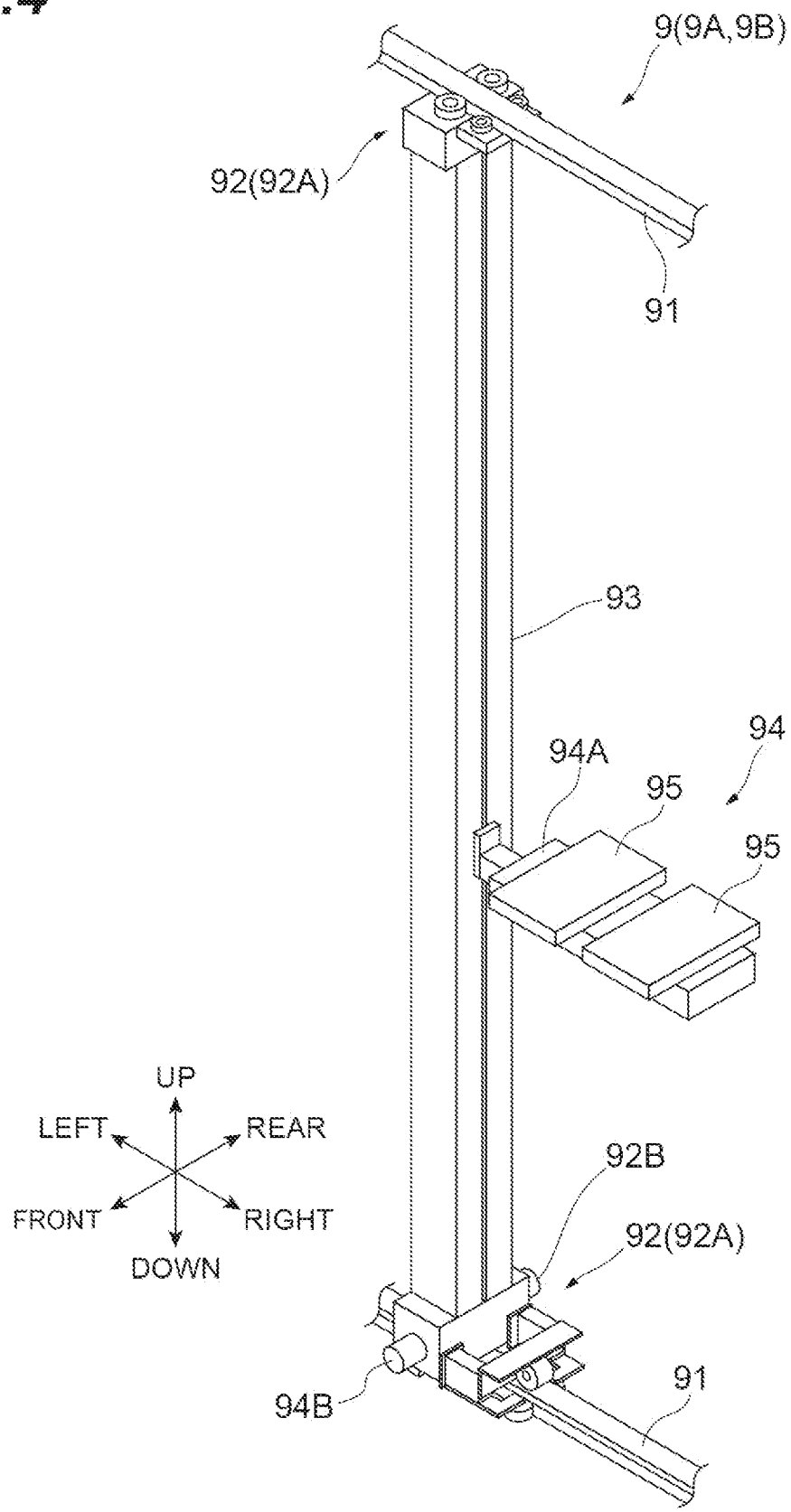
FIG. 4 is a perspective view of a first conveying device and a second conveying device.

As illustrated in FIG. 4, the first conveying device 9A and the second conveying device 9B are stacker cranes configured to travel along rails 91, 91 installed on a floor and a ceiling. The first conveying device 9A and the second conveying device 9B each include traveling units 92, 92 configured to travel along the rails 91, 91 installed on the floor and the ceiling, respectively; a mast 93 connecting the traveling units 92, 92; a lifting unit 94 movable along the mast 93; and two transfer units 95, 95 provided to the lifting unit 94.

Each traveling unit 92 includes: a rolling unit 92A configured to support wheels rolling on the corresponding rail 91; and a drive unit 92B such as a motor configured to rotate at least one wheel provided to the rolling unit 92A. The traveling unit 92 configured to travel along the rail 91 on the floor is configured as a driving wheel, and the traveling unit 92 configured to travel along the rail 91 on the ceiling is configured as a driven wheel. The lifting unit 94 includes a support 94A supporting the transfer units 95, 95 and a drive unit 94B configured to move the support 94A in the up-and-down direction. The drive unit 94B is provided to the traveling unit 92 on the lower side.

The transfer unit 95 is provided to be able to move forward and backward (advance and retreat) in the front-rear direction (in the direction orthogonal to the traveling direction and the vertical direction), and receives and delivers a battery B from and to the take-in conveyor 2, the inspection device 4, the first carrying conveyor 5A, the second carrying conveyor 5B, the storage device 6, and the take-out conveyor 7. At least the second conveying device 9B is provided with the two transfer units 95 to be able to simultaneously transfer a plurality of batteries B accommodated side by side horizontally (in the left-and-right direction) in the storage device 6. In other words, the second conveying device 9B can simultaneously remove two (a plurality of) batteries B from the storage device 6 and simultaneously place the removed batteries B on the take-out conveyor 7.

Referring back to FIGS. 1 and 2, the inspection device 4 is an inspection device configured to perform a charge-and-discharge inspection process, a voltage/current/resistance inspection process, and an aging process, for example. The aging process is a process of storing a battery B for a certain period of time, and the voltage before and after the aging process is measured to determine whether it passes or fails based on whether it is within a threshold. The inspection device 4 is configured to be able to inspect a plurality of batteries B simultaneously. In the inspection device 4, an inspection unit 41 having an inspection chamber 42 configured to accommodate a battery B is arranged horizontally (in the left-and-right direction) and vertically (in the up-and-down direction). In other words, the inspection device 4 includes a plurality of the inspection units 41. When each battery B has been accommodated, the inspection device 4 starts inspection, and when the inspection has been completed, the inspection device 4 notifies the controller 10 (see FIG. 5) of the completion (inspection completion notification). The inspection device 4 also notifies the controller 10 (see FIG. 5) of inspection results (presence or absence of a defect). In a charge-and-discharge inspection or an aging inspection, variations occur in time from when batteries B to be inspected have been accommodated in the inspection chambers 42 until the respective inspections are completed.

The carrying conveyor 5 is provided between the inspection device 4 and the storage device 6. The carrying conveyor 5 is, for example, a device such as a belt conveyor or a roller conveyor configured to convey a tray T while supporting the bottom thereof. The carrying conveyor 5 includes the first carrying conveyor 5A disposed on a side closer to the inspection device 4 and the second carrying conveyor 5B disposed below the storage device 6. The carrying conveyor 5 is controlled by the controller 10 (see FIG. 5). In a delivery section A4 of the carrying conveyor 5, a second acquisition unit 14 configured to read a tag TG affixed to each T is provided. The second acquisition unit 14 transmits acquired information to the controller 10 (see FIG. 5).

The storage device 6 stores the batteries B that have been inspected in the inspection device 4. The storage device 6 is disposed above the second carrying conveyor 5B, which is part of the carrying conveyor 5, and the take-out conveyor 7. This configuration can save space for the entire battery inspection system 1 compared to when the second carrying conveyor 5B, the take-out conveyor 7, and the storage device 6 are disposed side by side along the conveying direction of the first conveying device 9A and the second conveying device 9B instead of disposing the storage device 6 above the second carrying conveyor 5B and the take-out conveyor 7. The storage device 6 may be disposed above the take-in conveyor 2. The storage device 6 includes a plurality of shelves 61, which are arranged horizontally (in the left-and-right direction) and vertically (in the up-and-down direction). Batteries B are brought into and retrieved from the storage device 6 by the second conveying device 9B. The second conveying device 9B brings the batteries B conveyed to a loading section A1 of the second carrying conveyor 5B into the storage device 6, and delivers the batteries B retrieved from the storage device 6 to the take-out conveyor 7 at an unloading section A2 of the take-out conveyor 7. Storage control of determining to which shelf 61 of the storage device 6 a battery B received from the second carrying conveyor 5B should be stored will be described later in detail.

The shelves 61 of the storage device 6 are preferably provided such that the number thereof corresponds to the number of groups handled by group control described later in detail. For example, when N groups are handled, the storage device 6 is preferably provided with shelves 61, the number of which is (M (the number of stackings in the incoming stack S1)−1)×N. If the number of the provided shelves 61 is equal to or larger than this number, batteries can be flexibly brought into the storage device 6, and even when the number of groups to be handled increases, the groups can be handled without taking measures such as adding equipment.

The take-out conveyor 7 takes the batteries B out of the battery inspection system 1. Each battery B is delivered from the second conveying device 9B or the second carrying conveyor 5B while being accommodated in the corresponding tray T. The take-out conveyor 7 is, for example, a device such as a belt conveyor or a roller conveyor configured to convey the tray T while supporting the bottom thereof. The take-out conveyor 7 is controlled by the controller 10 (see FIG. 5).

Figure 3B:
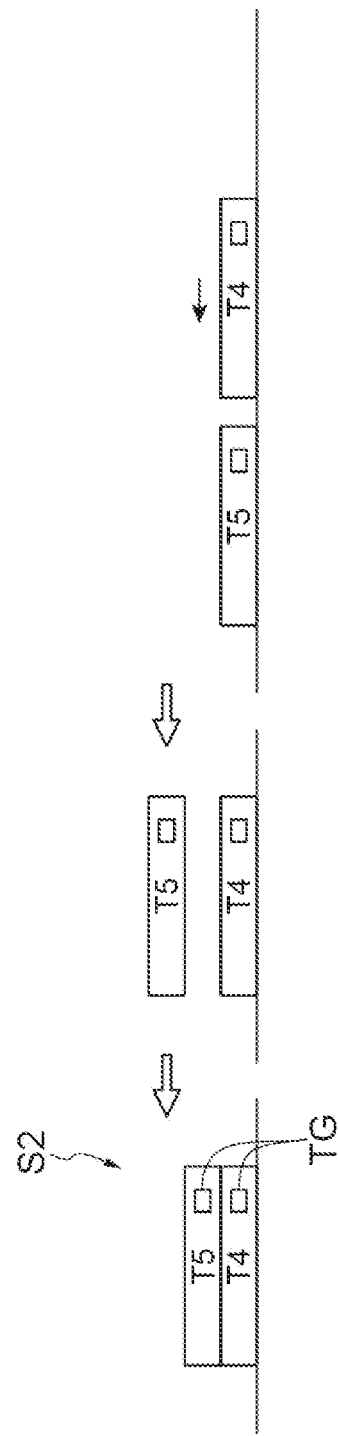
FIG. 3(B) is a diagram illustrating how batteries are stacked by a stacking device.

The stacking device 8 is provided midway on a path of the take-out conveyor 7. The stacking device 8 is a device configured to stack trays T conveyed one by one to form an outgoing stack S2. Specifically, by operation of the stacking device 8 and the take-out conveyor 7, the outgoing stack S2 is formed. More specifically, as illustrated in FIG. 3(B), the stacking device 8 lifts the conveyed tray T5. The take-out conveyor 7 conveys the tray T4 downstream for a certain distance, and then stops. Subsequently, the unstacking device 3 places the lifted tray T5 onto the tray T4. By repeating the processes of lifting trays T by the stacking device 8 and intermittent conveyance by the take-out conveyor 7 in this manner, the outgoing stack S2 is formed.

The take-out conveyor 7 takes out the outgoing stack S2 formed by the stacking device 8. The stacking order of the incoming stack S1 when taken in onto the take-in conveyor 2 and the stacking order of the outgoing stack S2 when taken out of the take-out conveyor 7 are the same. The stacking order herein refers to the order in which the trays T are stacked from the bottom in the incoming stack S1 (the outgoing stack S2). Specifically, this refers to the order of the tray T1, the tray T2, the tray T3, the tray T4, and the tray T5. The stacking device 8 is controlled by the controller 10 (see FIG. 5).

Figure 5:
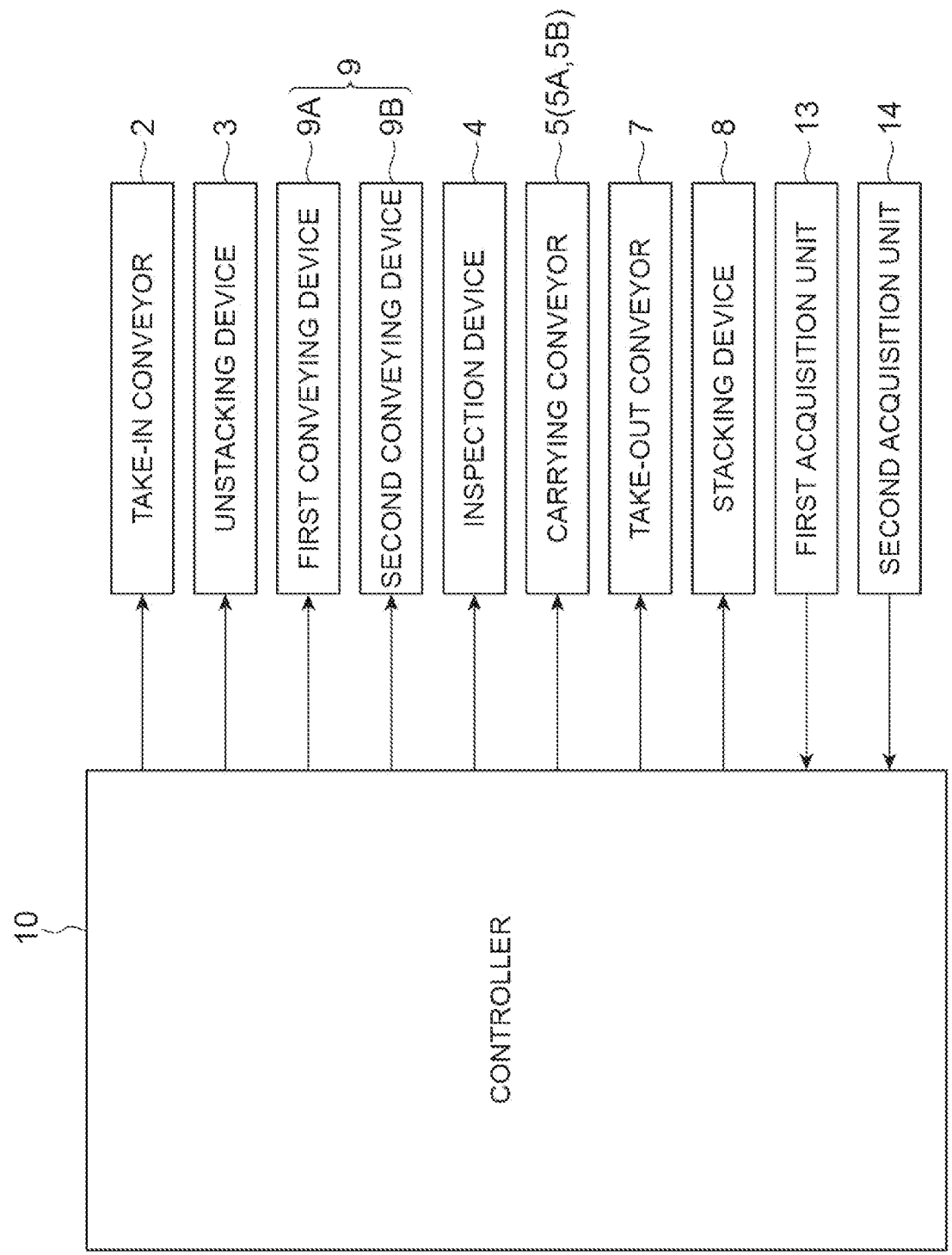
FIG. 5 is a block diagram illustrating a functional configuration of the battery inspection system.

The controller 10 illustrated in FIG. 5 controls the entire battery inspection system 1. More specifically, the controller 10 controls the take-in conveyor 2, the unstacking device 3, the conveying device 9, the inspection device 4, the carrying conveyor 5, the take-out conveyor 7, and the stacking device 8.

The controller 10 includes: an input/output interface for inputting and outputting signals or the like to and from outside; storage media such as a read only memory (ROM) storing programs, information, and the like for processing and a random access memory (RAM) configured to temporarily store data; a central processing unit (CPU); and communication circuits. The controller 10 stores input data in the RAM on the basis of signals output by the CPU, loads the programs stored in the ROM into the RAM, and performs various processes by executing the programs loaded into the RAM.

The controller 10 performs the group control, inspection control, the storage control, and stacking control. The following describes the respective controls in detail.

The group control manages a predetermined number of batteries B taken in by the take-in conveyor 2 as a same group. The group control manages a set of batteries B, which are accommodated in trays T unstacked from one incoming stack S1 by the unstacking device 3, as the same group. In the group control, five batteries B (trays T) formed from one incoming stack S1 are managed as the same group.

For the management of the same group, among tags (identifiers) TG affixed to the respective trays T, one tag TG affixed to the lowermost tray T of the incoming stack S1 is used (see FIG. 3(A)). The controller 10 manages (stores) the number of trays T constituting the incoming stack S1 and the order of stacking thereof. Thus, by acquiring information on the tag TG affixed to one (e.g., the lowermost tray T) of the trays T constituting the incoming stack S1, the trays T stacked on top of this tray T can be associated with this tag TG and stored, i.e., can be managed (stored) as the same group. The controller 10 also manages into which inspection chamber 42 of the inspection device 4 each of these trays T (batteries B) managed on a group basis is taken, for example. Thus, the controller 10 can also manage information such as to which group each tray T (battery B) that has been inspected in the inspection device 4 and is to be retrieved from the inspection chamber 42 belongs and at which position in the incoming stack S1 the tray T (battery B) was stacked.

A tag TG is affixed to each of all trays T constituting the incoming stack S1 to record the inspection results of inspections passed/failed in the inspection device 4. However, if only management on a group basis is to be performed, a configuration may be used in which one tag TG is provided to one incoming stack S1. This configuration can reduce the cost of affixing tags TG. Herein, an example has been described in which each group is managed by using the tag TG affixed to the lowermost tray T constituting the corresponding incoming stack S1. However, for example, the tag TG affixed to the uppermost tray T or the tag TG affixed to the tray T in the middle of the stacking direction may also be used.

The group control manages defective batteries that have been determined to be defective by the inspection device 4 as the same group. The storage control for the batteries B determined to be defective batteries will be described later in detail.

The inspection control controls the first conveying device 9A to bring a battery B taken in by the take-in conveyor 2 into the inspection device 4 that is not performing inspection, and also controls the first conveying device 9A to retrieve a battery B that has been inspected from the inspection device 4. The controller 10 monitors the operational status of each inspection chamber 42, using inspection completion signals, for example, transmitted from the inspection device 4. The controller 10 causes the battery B to be brought into an empty inspection chamber 42 on the basis of this operational status, and causes the battery B that has been inspected to be retrieved from the inspection chamber 42 on the basis of the inspection completion signal. In the inspection control, the first conveying device 9A is controlled to deliver the battery B, which has retrieved from the inspection chamber 42, to the first carrying conveyor 5A.

The storage control controls the conveying device 9 to store at least some of batteries B, which have been retrieved from the inspection device 4, into the storage device 6. The storage control stores four, of five batteries B that are managed as one group by the group control, into the storage device 6. Herein, all five batteries B managed as one group may be stored in the storage device 6.

The storage control also controls the second conveying device 9B such that batteries B managed as the same group are stored on shelves 61 adjacent to each other. The storage control further controls the second conveying device 9B for storage in the storage device 6 such that, when two batteries B have been removed simultaneously from the storage device 6 and the removed batteries B have been placed simultaneously on the take-out conveyor 7, an outgoing stack S2 is formed in the same stacking order as the stacking order of the corresponding incoming stack S1 by the stacking device 8. The details of this control will be described later.

The storage control controls the second conveying device 9B, the second carrying conveyor 5B, and the take-out conveyor 7 such that all batteries B managed as the same group are continuously delivered from the inspection device 4 to the take-out conveyor 7 or from the carrying conveyor 5 to the take-out conveyor 7 on at least one of the conditions that: all batteries B managed as the same group have been retrieved from the inspection device 4 (condition example 1); all batteries B managed as the same group have been brought into the storage device 6 (condition example 2); and the last battery of the batteries B managed as the same group has reached the second carrying conveyor 5B (condition example 3). The storage control also controls the second conveying device 9B, the second carrying conveyor 5B, and the take-out conveyor 7 such that, on the condition that a predetermined number of (e.g., five) defective batteries have been retrieved from the inspection device 4, the predetermined number of defective batteries are continuously delivered from the inspection device 4 to the take-out conveyor 7 or the second carrying conveyor 5B to the take-out conveyor 7.

The following describes operation of the battery inspection system 1. Herein, as illustrated in FIG. 3(A), an example will be described in which an incoming stack S1 that has been stacked in the order of the tray T1, the tray T2, the tray T3, the tray T4, and the tray T5 from the bottom has been taken in by the take-in conveyor 2.

When the incoming stack S1 has been taken in by the take-in conveyor 2, the unstacking device 3 unstacks the trays T into individual ones. At this time, the controller 10 manages a set of batteries B, accommodated in a plurality of trays T unstacked from the one incoming stack S1 by the unstacking device 3, as the same group (group control). Each of the unstacked trays T is conveyed downstream to the delivery section A3 by the take-in conveyor 2.

The first conveying device 9A receives the corresponding battery B from the take-in conveyor 2 at the delivery section A3. The first conveying device 9A checks the status of vacancy in the inspection device 4, and then brings the battery B into a vacant inspection chamber 42. The first conveying device 9A brings the batteries B, which are conveyed one after another by the take-in conveyor 2, into vacant inspection chambers 42. In the inspection device 4, when each battery B is brought into the corresponding inspection chamber 42, inspection is started, and when the inspection has been completed, an inspection completion notification is transmitted to the controller 10. The first conveying device 9A retrieves the battery B that has been inspected from the inspection chamber 42 and delivers the battery B to the carrying conveyor 5. The controller 10 controls such bringing-in and retrieval of the battery B into and from the inspection device 4 (inspection control).

The first carrying conveyor 5A receives each battery B from the first conveying device 9A at the upstream delivery section A4, and conveys it to the loading section A1. The second conveying device 9B receives the battery B conveyed to the loading section A1, and brings it onto a shelf 61 of the storage device 6. The second conveying device 9B places the battery B retrieved from the shelf 61 of the storage device 6 onto the unloading section A2 of the take-out conveyor 7, and delivers the battery B to the take-out conveyor 7. The controller 10 causes each battery B to be brought into a shelf 61 of the storage device 6, and causes it to be retrieved to the take-out conveyor 7 on the predetermined conditions. The controller 10 controls such bringing-in and retrieval of the battery B into and from the storage device 6 (storage control).

Figure 6:
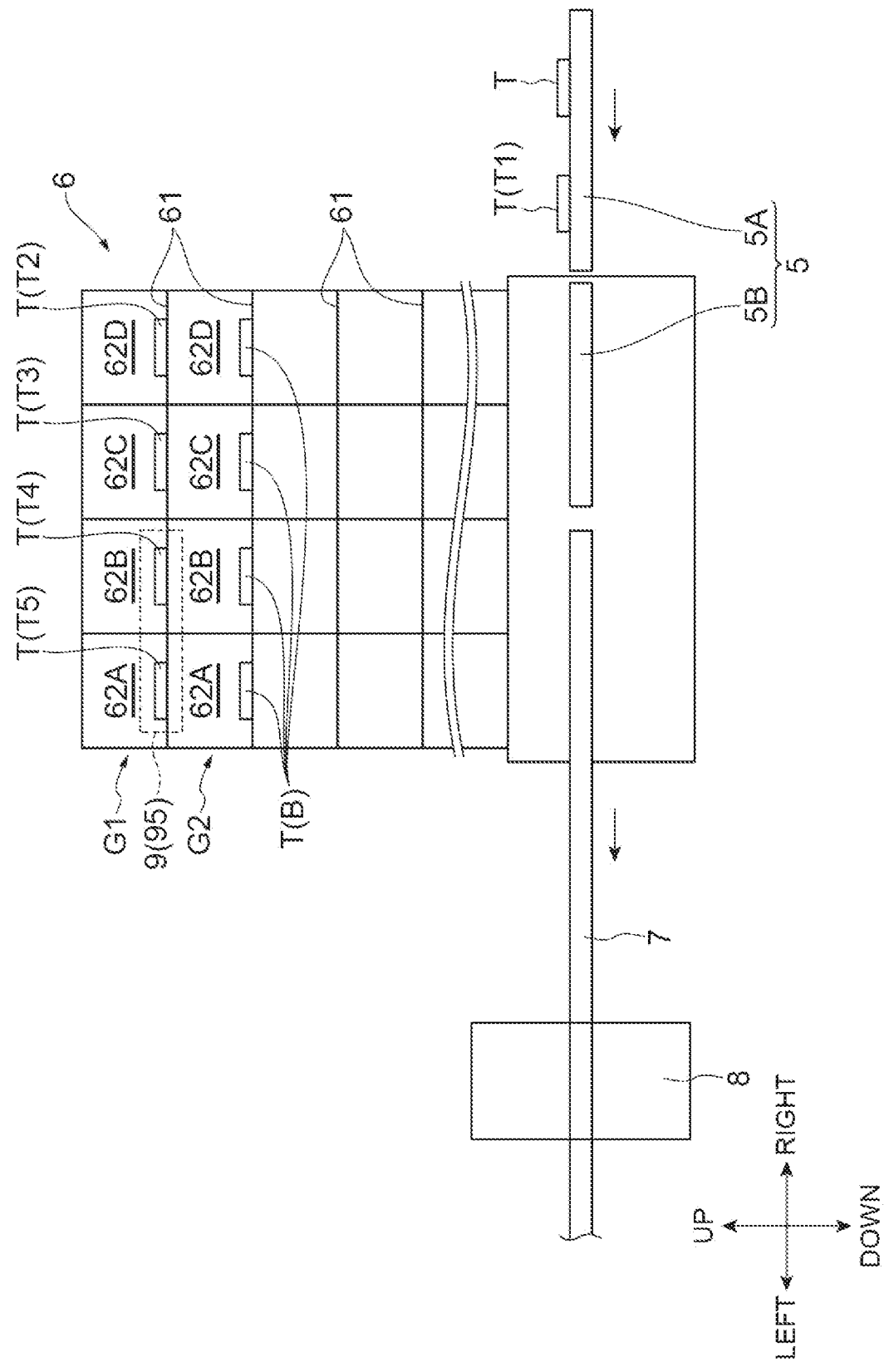
FIG. 6 is a diagram illustrating an example of storage control in the battery inspection system.

As illustrated in FIG. 6, the second conveying device 9B brings the batteries B managed as the group G1 into four horizontally adjacent shelves 61. More specifically, the second conveying device 9B brings the respective trays T5, T4, T3, and T2 into the shelves 61 that form accommodation spaces 62A, 62B, 62C, and 62D, which are arranged in a row from the downstream side of the take-out conveyor 7 toward the upstream side thereof. In other words, the second conveying device 9B brings in the trays T accommodating the batteries B such that a battery B disposed at a higher position of the incoming stack S1 onto a shelf 61 closer to the downstream side of the take-out conveyor 7. A set of batteries managed as another group G2 is also stored on horizontally adjacent four shelves 61 in the same manner as for the group G1. The order in which the trays T are brought into the four shelves 61 described above is an example, and is not limited to this. For example, the respective trays T1, T2, T3, and T4 may be brought onto the shelves 61 that form the accommodation spaces 62A, 62B, 62C, and 62D.

In such a state of storage in storage device 6, when the fifth battery B in the group G1 has been retrieved from the inspection device 4 (all batteries B belonging to the group G1 have been retrieved from the inspection device 4), the second conveying device 9B or the second carrying conveyor 5B continuously delivers all the batteries B of the group G1 to the take-out conveyor 7.

More specifically, as illustrated in FIG. 7, the two transfer units 95, 95 of the second conveying device 9B simultaneously remove the batteries B, B accommodated in the two trays T5, T4 from the shelf 61 forming the accommodation space 62A and the shelf 61 forming the accommodation space 62B in the storage device 6, and simultaneously place the removed batteries B, B on the take-out conveyor 7. Subsequently, as illustrated in FIG. 8, the two transfer units 95, 95 of the second conveying device 9B simultaneously remove the batteries B, B accommodated in the two trays T3, T2 from the shelf 61 forming the accommodation space 62C and the shelf 61 forming the accommodation space 62D in the storage device 6, and simultaneously place the removed batteries B, B on the take-out conveyor 7. As a result, the batteries B are arranged on the take-out conveyor 7 in the reverse order to the stacking order of the incoming stack S1. Specifically, the trays are arranged in the order of the tray T5, the tray T4, the tray T3, the tray T2, and the tray T1 from downstream of the take-out conveyor 7.

In the above example, a configuration has been described in which the tray T1 or the tray T5 is conveyed last by the first carrying conveyor 5A. However, another tray T (e.g., the tray T3) may be conveyed last. In this example, by the method described above, no shelf 61 is available to accommodate a tray T (the tray T1 or the tray T5) expected to be conveyed last. In this example, the second conveying device 9B may temporarily accommodate the tray T (the tray T1 or the tray T5) in another shelf 61 and perform the process of rearranging the trays T to be arranged in the same order as described above at appropriate timing.

The stacking device 8 stacks the batteries B accommodated in the trays T conveyed by the take-out conveyor 7 to form an outgoing stack S2 as described with reference to FIG. 3(B). The stacking device 8 forms the outgoing stack S2 stacked in the stacking order of the tray T1, the tray T2, the tray T3, the tray T4, and the tray T5 from the bottom. In other words, the battery inspection system 1 takes out the outgoing stack S2 stacked in the same order as that of the incoming stack S1.

Functional effects of the battery inspection system 1 according to the above example will be described. In the battery inspection system 1, a set of batteries that have been grouped when having been taken in by the take-in conveyor 2 is taken out together by the take-out conveyor 7. This allows a desired battery set to be taken out together. Furthermore, in the battery inspection system 1 thus configured, batteries B that have been inspected are immediately retrieved from the inspection device 4, and thus the next batteries B can be immediately received. This can increase the operating rate in the inspection device 4.

In the battery inspection system 1 according to the above example, the stacking device 8 is provided, and thus a set of batteries of the same group can be taken out as an outgoing stack S2. In the group control of the battery inspection system 1, a set of batteries constituting one incoming stack S1 that has been unstacked by the unstacking device 3 is managed as the same group. Thus, the batteries B in the battery set conveyed in a stacked state can be unstacked to be individually taken out to the inspection device 4. Furthermore, in the battery inspection system 1, even when a set of batteries brought in as an incoming stack S1 is unstacked to be inspected individually, an outgoing stacked unit S2 can be formed with the same set of batteries again and taken out. Without the storage device 6, when N groups are to be managed, as many stacking devices 8 are needed as the number of groups (N). By contrast, in the battery inspection system 1 according to the above example, this situation can be handled with the stacking device 8, the number of which is smaller than N, by combining the storage device 6 and the stacking device 8.

In the battery inspection system 1 according to the above example, tags TG are provided on the respective trays T constituting an incoming stack S1, and the same group is managed based on the tags TG. This allows a set of batteries constituting one incoming stack S1 to be taken out to the take-out conveyor 7 in the stacking order thereof or the reverse order, and thus an outgoing stack S2 formed in the stacking order of the incoming stack S1 can be reproduced to be taken out. Consequently, the batteries B (trays T) can be taken out with "the same data and conditions" as before being taken into the inspection process, and thus data misalignment and occurrence of other troubles can be reduced.

In the battery inspection system 1 according to the above example, when a plurality of batteries B have been simultaneously removed from the storage device 6 and then simultaneously placed on the take-out conveyor 7, the removed batteries B are stored in the storage device 6 such that an outgoing stack S2 is formed in the stacking order in the stacking device 8. This enables efficient control, thereby improving the processing capacity when the outgoing stack S2 stacked in the same order as in the incoming stack S1 is taken out.

In the battery inspection system 1 according to the above example, batteries B managed as the same group are stored on horizontally adjacent shelves 61. This enables efficient control, thereby improving the processing capacity when outgoing stacks S2 are formed with the same set of batteries constituting each incoming stack S1 and are taken out.

In the battery inspection system 1 according to the above example, defective batteries determined to be defective by the inspection device 4 are managed as the same group, and when a predetermined number of defective batteries have been retrieved from the inspection device 4, the predetermined number of defective batteries are continuously delivered from the inspection device 4 or storage device 6 to the take-out conveyor 7. This enables the defective batteries to be taken out together. Defective trays accommodating the defective batteries are conveyed to an external discharge conveyor (not illustrated). When the defective trays are taken out together compared to when the defective trays are discharged one by one from the battery inspection system 1, load on a conveying device (not illustrated) to the external discharge conveyor can be reduced. Defective trays taken out to the trailing edge of the discharge conveyor is generally removed by an operator. However, when the defective trays are taken out together, the number of times the operator needs to do this can be reduced.

In the battery inspection system 1 according to the above example, conveyance of batteries B between the take-in conveyor 2 and the inspection device 4, between the inspection device 4 and the first carrying conveyor 5A, between the second carrying conveyor 5B and the storage device 6, and between the storage device 6 and the take-out conveyor, where bottlenecks are more likely to occur, is performed in a distributed manner by two conveying devices of the first conveying device 9A and the second conveying device 9B. This prevents reduction in conveyance efficiency.

Although an example has been described above, this disclosure is not limited to the above example. Various modifications may be made without departing from the gist of the disclosure.

In the above example, a configuration has been described in which the number of stackings in the incoming stack S1 taken in by the take-in conveyor 2 is five. However, my systems are not limited to this example. This number may be two or more and four or less, or six or more. The same applies to the number of stackings in the stack S to be taken out by the take-out conveyor 7.

In the example and the modifications above, a configuration has been described in which a plurality of batteries B conveyed as an incoming stack S1 are grouped. However, in a form in which batteries B are conveyed one by one by the take-in conveyor 2 instead of the form of the incoming stack S1, they may be grouped for each predetermined number (e.g., five) in the order in which they are taken in, for example. In other words, the battery inspection system 1 may be a battery inspection system without the unstacking device 3 and the stacking device 8. In this example, the above-described predetermined number may be the number of products in a production unit (lot) manufactured under the same conditions. In this configuration, batteries B can be grouped under desired conditions and the grouped batteries B can be taken out together from the take-out conveyor 7.

In the example and modifications above, a configuration has been described in which the battery B that is retrieved last from the inspection device 4 in the group is not taken onto a shelf 61 of the storage device 6. However, all retrieved batteries B may be brought into the storage device 6. In this example, the second conveying device 9B may rearrange the batteries B accommodated on the shelves 61 at appropriate timing. Not only the battery B that is retrieved last from the inspection device 4 in the group, but also a plurality of batteries B do not have to be brought onto shelves 61 of the storage device 6.

In the example and the modifications above, a configuration has been described in which, as illustrated in FIG. 4, the first conveying device 9A and the second conveying device 9B each have one lifting unit 94 provided with the two transfer units 95, 95. However, for example, a configuration may be used that includes a first conveying device 9A and a second conveying device 9B each of which has two lifting units 94, 94 disposed with a mast 93 interposed therebetween and each provided with the corresponding one of the transfer units 95, 95. In this configuration, the controller 10 may, for example, control the second conveying device 9B such that batteries B managed as the same group are stored on vertically adjacent shelves 61. When a plurality of batteries B are simultaneously removed from shelves 61 and the removed batteries B are simultaneously placed on the take-out conveyor 7, the controller 10 may control the second conveying device 9B such that these batteries B are stored in vertically adjacent shelves 61 in order to form an outgoing stack S2 in the stacking order of the incoming stack S1 or the reverse order thereto.

In the example and the modifications above, a configuration has been described in which a tag TG is affixed to each of all batteries B (trays T). However, for example, the tag TG may be affixed to only one battery B (e.g., a battery B disposed lowermost) that forms the incoming stack S1.

In the example and the modifications above, a configuration has been described in which two conveying devices 9 of the first conveying device 9A and the second conveying device 9B are provided. However, a configuration may be used in which only one conveying device is provided. In this example, installation of the carrying conveyor 5 may be omitted, and this conveying device 9 may be configured to directly convey batteries B from the inspection device 4 to the storage device 6. In this example, instead of the configuration in the example and the modifications above in which the inspection device 4 and the storage device 6 are disposed apart, the inspection device 4 and the storage device 6 may be arranged side by side (as a series of racks).

In the example and the modifications above, a configuration has been described in which, in the unstacking device 3, the batteries are taken out in order starting from the battery B disposed lower in the incoming stack S1 as illustrated in FIG. 3(A). However, the unstacking device 3 may be configured to take out the batteries in order starting from the battery B disposed upper in the incoming stack S1. Similarly, an example has been described in which, in the stacking device 8, a battery B that has been sent earlier is stacked at a higher position in the outgoing stack S2. However, the stacking device 8 may be configured to stack a battery B that has been sent earlier at a lower position in the outgoing stack S2. In these examples, the order in which the batteries B are delivered to the storage device 6 and the take-out conveyor 7 is the reverse order to that described above.

In the example and the modifications above, a configuration has been described in which batteries B accommodated in trays T are conveyed. However, the batteries B may be directly conveyed by the take-in conveyor 2, the conveying device 9, the carrying conveyor 5, and the take-out conveyor 7.

The invention claimed is:

1. A battery inspection system for inspecting batteries, comprising:
   an inspection device configured to be able to inspect a plurality of batteries simultaneously;
   a storage device including a plurality of shelves configured to store the batteries that have been inspected by the inspection device;
   a take-in conveyor configured to take the batteries into the battery inspection system from outside;
   a take-out conveyor configured to take the batteries out of the battery inspection system;
   a conveying device configured to convey the batteries between the take-in conveyor and the inspection device, between the inspection device and the storage device, and between the storage device and the take-out conveyor;
   a controller configured to control the battery inspection system, wherein
   the controller performs:
      group control of managing a predetermined number of the batteries taken in by the take-in conveyor as a same group;
      inspection control of controlling the conveying device to bring the batteries taken in by the take-in conveyor into the inspection device that is not performing inspection, and also controlling the conveying device to retrieve the batteries that have been inspected from the inspection device; and
      storage control of controlling the conveying device to store at least some of the batteries retrieved from the inspection device into the storage device, and also controlling the conveying device to continuously deliver a set of batteries of the same group from the inspection device or the storage device to the take-out conveyor; and
   a stacking device provided midway on a path of the take-out conveyor and configured to stack the batteries to form an outgoing stack, wherein the controller performs stacking control of controlling the stacking device to form the outgoing stack with a set of batteries of the same group.

2. The battery inspection system according to claim 1, wherein
   the conveying device includes a transfer unit capable of simultaneously transferring the batteries accommodated side by side horizontally in the storage device, and
   when the batteries have been simultaneously removed from the storage device and the removed batteries have been simultaneously placed on the take-out conveyor, the storage control causes the storage device to store the batteries such that the outgoing stack is formed in stacking order of the incoming stack or reverse order to the stacking order;
   the battery inspection system further comprising:
      an unstacking device provided midway on a path of the take-in conveyor and configured to unstack the batteries of an incoming stack, in which the batteries are stacked, one by one, wherein the group control manages a set of batteries constituting the one incoming stack and unstacked by the unstacking device as the same group.

3. The battery inspection system according to claim 2, wherein the storage control controls the conveying device such that the batteries managed as the same group are stored on horizontally adjacent shelves.

4. A battery inspection system for inspecting batteries, comprising:
- an inspection device configured to be able to inspect a plurality of batteries simultaneously;
- a storage device including a plurality of shelves configured to store the batteries that have been inspected by the inspection device;
- a take-in conveyor configured to take the batteries into the battery inspection system from outside;
- a take-out conveyor configured to take the batteries out of the battery inspection system;
- a conveying device configured to convey the batteries between the take-in conveyor and the inspection device, between the inspection device and the storage device, and between the storage device and the take-out conveyor;
- a controller configured to control the battery inspection system, wherein
- the controller performs:
  - group control of managing a predetermined number of the batteries taken in by the take-in conveyor as a same group;
  - inspection control of controlling the conveying device to bring the batteries taken in by the take-in conveyor into the inspection device that is not performing inspection, and also controlling the conveying device to retrieve the batteries that have been inspected from the inspection device; and
  - storage control of controlling the conveying device to store at least some of the batteries retrieved from the inspection device into the storage device, and also controlling the conveying device to continuously deliver a set of batteries of the same group from the inspection device or the storage device to the take-out conveyor; and
- an unstacking device provided midway on a path of the take-in conveyor and configured to unstack the batteries of an incoming stack, in which the batteries are stacked, one by one, wherein the group control manages a set of batteries constituting the one incoming stack and unstacked by the unstacking device as the same group.

5. The battery inspection system according to claim 4, wherein the storage control takes out a set of batteries of the same group to the take-out conveyor in stacking order of the incoming stack or reverse order to the stacking order.

6. The battery inspection system according to claim 4, wherein at least one of the batteries constituting the incoming stack is provided with an identifier, and the group control manages the same group based on the identifier.

7. A battery inspection system for inspecting batteries, comprising:
- an inspection device configured to be able to inspect a plurality of batteries simultaneously;
- a storage device including a plurality of shelves configured to store the batteries that have been inspected by the inspection device;
- a take-in conveyor configured to take the batteries into the battery inspection system from outside;
- a take-out conveyor configured to take the batteries out of the battery inspection system;
- a conveying device configured to convey the batteries between the take-in conveyor and the inspection device, between the inspection device and the storage device, and between the storage device and the take-out conveyor;
- a controller configured to control the battery inspection system, wherein
- the controller performs:
  - group control of managing a predetermined number of the batteries taken in by the take-in conveyor as a same group;
  - inspection control of controlling the conveying device to bring the batteries taken in by the take-in conveyor into the inspection device that is not performing inspection, and also controlling the conveying device to retrieve the batteries that have been inspected from the inspection device; and
  - storage control of controlling the conveying device to store at least some of the batteries retrieved from the inspection device into the storage device, and also controlling the conveying device to continuously deliver a set of batteries of the same group from the inspection device or the storage device to the take-out conveyor; and
- a carrying conveyor provided between the inspection device and the storage device, wherein
- the conveying device includes:
  - a first conveying device configured to convey the batteries between the take-in conveyor and the inspection device and between the inspection device and the carrying conveyor; and
  - a second conveying device configured to convey the batteries between the carrying conveyor and the storage device and between the storage device and the take-out conveyor.

* * * * *